(12) United States Patent
Tandou et al.

(10) Patent No.: US 8,833,089 B2
(45) Date of Patent: Sep. 16, 2014

(54) PLASMA PROCESSING APPARATUS AND MAINTENANCE METHOD THEREFOR

(75) Inventors: Takumi Tandou, Asaka (JP); Masaru Izawa, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 855 days.

(21) Appl. No.: 12/538,986

(22) Filed: Aug. 11, 2009

(65) Prior Publication Data

US 2010/0326094 A1 Dec. 30, 2010

(30) Foreign Application Priority Data

Jun. 24, 2009 (JP) .................................. 2009-149789

(51) Int. Cl.
*F25B 9/00* (2006.01)
*F25B 45/00* (2006.01)
*H01J 37/32* (2006.01)

(52) U.S. Cl.
CPC ....... *H01J 37/32091* (2013.01); *F25B 2500/06* (2013.01); *F25B 45/00* (2013.01); *H01J 2237/2001* (2013.01)
USPC .............................................................. 62/6

(58) Field of Classification Search
CPC ........... F25B 2345/00; F25B 2345/002; F25B 2345/003
USPC .............. 62/6, 77, 515, 524, 525, 174, 324.4; 156/345.53, 345.27; 219/121.49, 219/121.59, 121.36; 277/637; 315/111.21; 417/30

See application file for complete search history.

(56) References Cited

U.S. PATENT DOCUMENTS

| 6,630,293 | B1 * | 10/2003 | Kuno et al. ................... 430/620 |
| 6,700,089 | B1 * | 3/2004 | Hirooka ..................... 219/121.4 |
| 6,993,919 | B2 * | 2/2006 | Hirooka et al. ................. 62/115 |
| 7,000,416 | B2 * | 2/2006 | Hirooka et al. .............. 62/259.2 |
| 2004/0068997 | A1 * | 4/2004 | Hirooka et al. ................. 62/175 |
| 2005/0045104 | A1 * | 3/2005 | Arai et al. ..................... 118/724 |
| 2005/0072171 | A1 * | 4/2005 | Jensen ........................... 62/183 |
| 2006/0201172 | A1 * | 9/2006 | Kaneko et al. .................. 62/180 |
| 2008/0011422 | A1 * | 1/2008 | Masuda et al. ........... 156/345.24 |
| 2008/0017107 | A1 * | 1/2008 | Arai et al. ..................... 118/712 |
| 2008/0023448 | A1 * | 1/2008 | Tandou et al. ........... 219/121.36 |
| 2008/0178608 | A1 * | 7/2008 | Tandou et al. ...................... 62/6 |
| 2008/0203925 | A1 * | 8/2008 | Tandou et al. ........... 315/111.21 |
| 2008/0289767 | A1 * | 11/2008 | Tandou et al. ........... 156/345.53 |

FOREIGN PATENT DOCUMENTS

| JP | 06-346256 | * 12/1994 | ................ C23F 4/00 |
| JP | 06346256 | * 12/1994 | ................ C23F 4/00 |

(Continued)

*Primary Examiner* — Frantz Jules
*Assistant Examiner* — Emmanuel Duke
(74) *Attorney, Agent, or Firm* — Antonelli, Terry, Stout & Kraus, LLP.

(57) ABSTRACT

In a plasma processing apparatus, a check valve is installed close to a refrigerant inlet of a compressor. When performing maintenance of a sample stage, refrigerant collected from a refrigerant flow path is temporarily stored in a flow path section extending from an expansion valve to the check valve, making it possible to perform the maintenance without changing the amount of refrigerant in the refrigerating cycle. With a refrigerant storage tank, a refrigerant supply valve, and a refrigerant discharge valve included in the refrigerating cycle, when maintenance of the compressor, a condenser, or the expansion valve is performed, the refrigerant collected from the refrigerating cycle can be put in use again.

17 Claims, 7 Drawing Sheets

(56) References Cited

FOREIGN PATENT DOCUMENTS

| JP | 2001-015440 | * | 1/2001 | ............ H01L 21/205 |
| JP | 2001015440 | * | 1/2001 | ............ H01L 21/205 |
| JP | 2003-174016 | | 6/2003 | |
| JP | 2005-089864 | * | 4/2005 | .............. C23C 16/46 |
| KR | 2001-0065311 | * | 7/2001 | .............. F25B 15/00 |

* cited by examiner

PART A (SEALING PART OF SAMPLE STAGE)

FIG.4C

PART B (PIPING JOINT)

(∗ REQUIRED FOR COMPRESSOR MAINTENANCE ONLY)

FIG.7

PLASMA PROCESSING APPARATUS AND MAINTENANCE METHOD THEREFOR

CLAIM OF PRIORITY

The present application claims priority from Japanese Patent Application JP 2009-149789 filed on Jun. 24, 2009, the content of which is hereby incorporated by reference into this application.

FIELD OF THE INVENTION

The present invention relates to a plasma processing apparatus and a maintenance method therefor, particularly to a plasma processing apparatus having a sample stage provided with a temperature control unit and being suitable for fine processing of a sample such as a wafer and a maintenance method therefor.

BACKGROUND OF THE INVENTION

With finer and finer semiconductor devices coming into use, the accuracy requirement for etching of samples such as wafers has been becoming severer year by year. To enable micro-patterns on wafer surfaces to be processed with high accuracy by a plasma processing apparatus, controlling the wafer surface temperature during etching is important. With larger-area wafers and higher etching rates being in demand, however, the magnitude of high-frequency power applied to the plasma processing apparatus tends to grow larger. For etching of insulating films, in particular, large power on the order of kilowatts has come to be applied to the plasma processing apparatus. When a larger power is used to etch a wafer surface, the impact energy of ions striking the wafer surface increases. This has been causing a problem of excessive temperature rises in wafers being etched. With higher form accuracy also being requested of wafer etching, a means for quickly and accurately controlling the temperature of a wafer being processed is demanded.

In a plasma processing apparatus, the surface temperature of a wafer can be controlled by controlling the surface temperature of the sample stage (electrostatic adsorption electrode) that is in contact with the back surface of the wafer via a heat transfer medium. According to a prior-art technique, the surface temperature of the sample stage is controlled by flowing a liquid refrigerant through a refrigerant flow path formed inside the sample stage. The liquid refrigerant is supplied to the flow path in the sample stage after being adjusted to a target temperature by a cooling unit or a heating unit provided in a refrigerant supply system. Besides, such a refrigerant supply system is configured such that the liquid refrigerant is sent out after once being stored in a tank and the liquid refrigerant has a large heat capacity, so that the refrigerant supply system is effective in keeping the surface temperature of a wafer constant. Since the temperature response of such a refrigerant supply system is slow, however, the refrigerant supply system is not capable of quick temperature control and its heat exchange efficiency is low. Besides, plasma processing apparatuses have been growing in size to cope with high input heats used in recent years. It has therefore been difficult to optimally control the surface temperature of a wafer being etched.

Under the circumstances, a direct expansion refrigerant supply system (hereinafter referred to as "a direct expansion refrigerating system") have been proposed, for example, in Japanese Patent Application Laid-Open Publication No. 2005-89864 and Japanese Patent Application Laid-Open Publication No. 2003-174016. In each of such direct expansion refrigerating systems, a refrigerant circulation system including a compressor for compressing refrigerant, a condenser for condensing the compressed refrigerant, and an expansion valve for expanding the refrigerant is provided for a sample stage and the sample stage is cooled by evaporating the refrigerant in a refrigerant flow path formed in the sample stage. Since a direct expansion refrigerating system makes use of the latent heat of refrigerant vaporization, its cooling efficiency is high and it can quickly control by pressure the refrigerant vaporization temperature. Hence, applying a direct expansion refrigerant supply system to a sample stage of a plasma processing apparatus makes it possible to efficiently and quickly control the temperature of a semiconductor wafer being etched using a high input heat.

SUMMARY OF THE INVENTION

In a direct expansion refrigerating system, a refrigeration effect is generated using the latent heat of refrigerant vaporization.

Hence, a refrigerant with a low boiling point is adopted for use in a direct expansion refrigerating system. R410a (hydrofluorocarbon) refrigerant, for example, has a boiling point of $-51.4°$ C. (where the atmospheric pressure is 101.3 KPa or lower). When a refrigerant is released into the atmosphere, it evaporates. When performing maintenance of a refrigerating cycle, therefore, it is necessary to collect in advance the refrigerant present in the refrigerating cycle.

A main part of maintenance of a refrigerating cycle is replacing a sample stage. After a plasma processing apparatus is used to etch wafers, it is necessary to expose, for cleaning purposes, the wafer placement surface of the sample stage to a plasma. Exposing the surface of the sample stage to the plasma causes the dielectric film formed for electrostatic adsorption on the surface of the sample stage to undergo time-dependent changes (changes in surface roughness and composition) resulting in a change in the adsorption performance of a wafer. The electrostatic adsorption performance of the wafer affects the amount of heat transferred between the wafer and the sample stage. When the performance deteriorates, such problems as a deviation of the wafer temperature during a plasma process from a predetermined temperature and a degradation of temperature uniformity over a wafer surface are caused. It is therefore necessary to periodically replace the sample stage.

The refrigerating cycle of the present invention includes an evaporator (a refrigerant flow path in the sample stage), a compressor, a condenser, and an expansion valve. In the following description of this specification, the compressor, the condenser, and the expansion valve combined will be referred to as a "temperature control unit." Namely, the refrigerating cycle includes the sample stage provided in a vacuum process chamber and the temperature control unit outside the vacuum process chamber.

Generally, in an existing method of maintenance of the interior of a refrigerating cycle, the refrigerant collected to perform the maintenance is disposed of.

The refrigeration performance of a refrigerating cycle is affected by the amount of refrigerant filled in the refrigerating cycle. Therefore, when the refrigerant filled in the refrigerating cycle is collected and disposed of to perform maintenance of the refrigerating cycle, it is necessary, when refilling refrigerant after the maintenance, to adjust the amount of refrigerant filled in the refrigerating cycle and check the performance of the system. To shorten the time required before the refrigerating cycle is restarted after the maintenance, it is desirable to perform the maintenance without replacing the refrigerant in the refrigerating cycle. Replacing the whole refrigerant in the refrigerating cycle to perform maintenance of the system increases the cost of maintenance. In addition, the refrigerant used in the direct expansion refrigerating system has a high global warming potential, so that disposing of the refrigerant generates a heavy burden on the environment. Hence, a maintenance method requiring less refrigerant to be disposed of is needed.

To address the above problems, according to the method proposed in Japanese Patent Application Laid-Open Publication No. 2005-89864, a reserve tank is connected to a refrigerant pipe, and a maintenance valve is installed in a refrigerant flow path leading to a sample stage and also in a refrigerant discharge path. In the configuration, when performing maintenance of the sample stage, the whole refrigerant in the refrigerant piping for the sample stage is collected into the reserve tank. Subsequently, the refrigerant piping for the sample stage is connected to the atmosphere, then the sample stage is replaced.

According to the method proposed in Japanese Patent Application Laid-Open Publication No. 2003-174016, too, a maintenance valve is installed in a refrigerant supply path leading to a sample stage and also in a refrigerant discharge path extending from the sample stage. The configuration allows maintenance of the sample stage to be performed requiring only the refrigerant present in the refrigerant path portion extending, between the maintenance valves, through the refrigerant flow path in the sample stage to be disposed of.

Neither of the above known methods, however, can be used without involving refrigerant disposal.

In the method according to Japanese Patent Application Laid-Open Publication No. 2005-89864, to perform maintenance of the sample stage, the reserve tank connected to a refrigerant pipe on the outlet side of a compressor is required. The reserve tank is designed to keep, while the temperature control unit is functioning, the amount of refrigerant circulating through the refrigerant piping constant. In Japanese Patent Application Laid-Open Publication No. 2005-89864, how to collect the whole refrigerant present in the refrigerant piping into the reserve tank when performing maintenance of the sample stage and how to re-use the refrigerant collected into the reserve tank are not described in detail. Also, in Japanese Patent Application Laid-Open Publication No. 2005-89864, no consideration is given to maintenance of a single component of the refrigerating cycle, i.e. the compressor, condenser, or expansion valve.

According to the method proposed in Japanese Patent Application Laid-Open Publication No. 2003-174016, when performing maintenance of a temperature control unit, the whole refrigerant in the refrigerating cycle has to be disposed of. Also, when, after evacuating the refrigerating cycle, purging the system with N2 gas, it is necessary to once stop the turbo-molecular pump. This may increase the time required to re-start the system after the maintenance. In Japanese Patent Application Laid-Open Publication No. 2003-174016, no consideration is given to maintenance of a single component of the refrigerating cycle, i.e. the compressor, the condenser, or the expansion valve.

An object of the present invention is to provide a plasma processing apparatus and a maintenance method therefor which can reduce the amount of refrigerant to be discharged when performing maintenance of a direct expansion refrigerating system and which can thereby reduce the apparatus downtime for maintenance, the maintenance cost, and the environmental burden caused by the maintenance.

Another object of the present invention is to provide a temperature control unit for a sample stage included in semiconductor manufacturing equipment which makes it also possible to perform maintenance of components other than the sample stage of a refrigerating cycle while arbitrarily controlling the amount of refrigerant in the refrigerating cycle.

To address the above problems, the present invention provides a plasma processing apparatus which has a vacuum process chamber including a sample stage installed therein and which transforms a process gas introduced thereinto into a plasma and processes, using the plasma, a surface of a sample placed on the sample stage. The plasma processing apparatus includes: a refrigerating cycle using a refrigerant flow path provided in the sample stage as an evaporator and including a compressor, a condenser, and an expansion valve which are provided outside the vacuum process chamber; a check valve installed close to a refrigerant inlet of the compressor; and a control unit which controls components of the refrigerating cycle and the check valve. In the plasma processing apparatus: the refrigerating cycle has a refrigerant flow path including a first flow path section extending from the expansion valve via the evaporator to the check valve and a second flow path section extending from the check valve via the compressor and the condenser to the expansion valve, the first flow path section and the second flow path section being mutually separable; and, when performing maintenance of the sample stage, the first flow path section and the second flow path section are separated from each other, refrigerant present in the first flow path section is collected into the second flow path section to be temporarily stored therein, and, when the maintenance is finished, the refrigerant temporarily stored in the second flow path section is placed in a state in which the refrigerant is usable again in the refrigerating cycle.

According to the present invention: maintenance of a sample stage can be performed without discharging refrigerant from the refrigerating cycle; and, when maintenance of a temperature control unit is performed, the amount of refrigerant to be discharged can be largely reduced compared with when a known method (in which the whole refrigerant is discharged) for maintenance of a temperature control unit is used. This can reduce the apparatus downtime for maintenance, the maintenance cost, and the environmental burden caused by the maintenance.

DETAILED DESCRIPTION OF THE PREFERRED EMBODIMENTS

The plasma processing apparatus according to an aspect of the present invention has a vacuum process chamber including a sample stage installed therein, transforms a process gas introduced into the vacuum process chamber into a plasma, and processes, using the plasma, a surface of a sample placed on the sample stage. The plasma processing apparatus includes: a refrigerating cycle using a refrigerant flow path provided in the sample stage as an evaporator and including a compressor, a condenser, and an expansion valve which are provided outside the vacuum process chamber; and a check valve installed close to a refrigerant inlet of the compressor. When performing maintenance of the sample stage, refrigerant collected from the evaporator is temporarily stored in a refrigerant flow path section extending from the expansion valve via the condenser to the check valve, making it possible to perform the maintenance without changing the amount of refrigerant in the refrigerating cycle.

According to another aspect of the present invention, the plasma processing apparatus has a refrigerating cycle using a refrigerant flow path provided in the sample stage as an evaporator and including a compressor, a condenser, and an expansion valve which are provided outside the vacuum process chamber. The refrigerating cycle includes a refrigerant storage tank, a refrigerant supply valve, and a refrigerant discharge valve. When maintenance of the refrigerating cycle is performed, the refrigerant collected from the system can be put in use again.

According to still another aspect of the present invention, the plasma processing apparatus has a refrigerating cycle using a refrigerant flow path provided in the sample stage as an evaporator and including a compressor, a condenser, and an expansion valve which are provided outside the vacuum process chamber. The refrigerating cycle includes a refrigerant storage tank and a vacuum exhaust unit. When maintenance of the refrigerating cycle is performed, the refrigerant collected from the system can be put in use again.

Embodiments of the present invention will be described below with reference to drawings.

First Embodiment

A first embodiment of the present invention will be described below with reference to FIGS. 1 to 4C.

Figure 1:
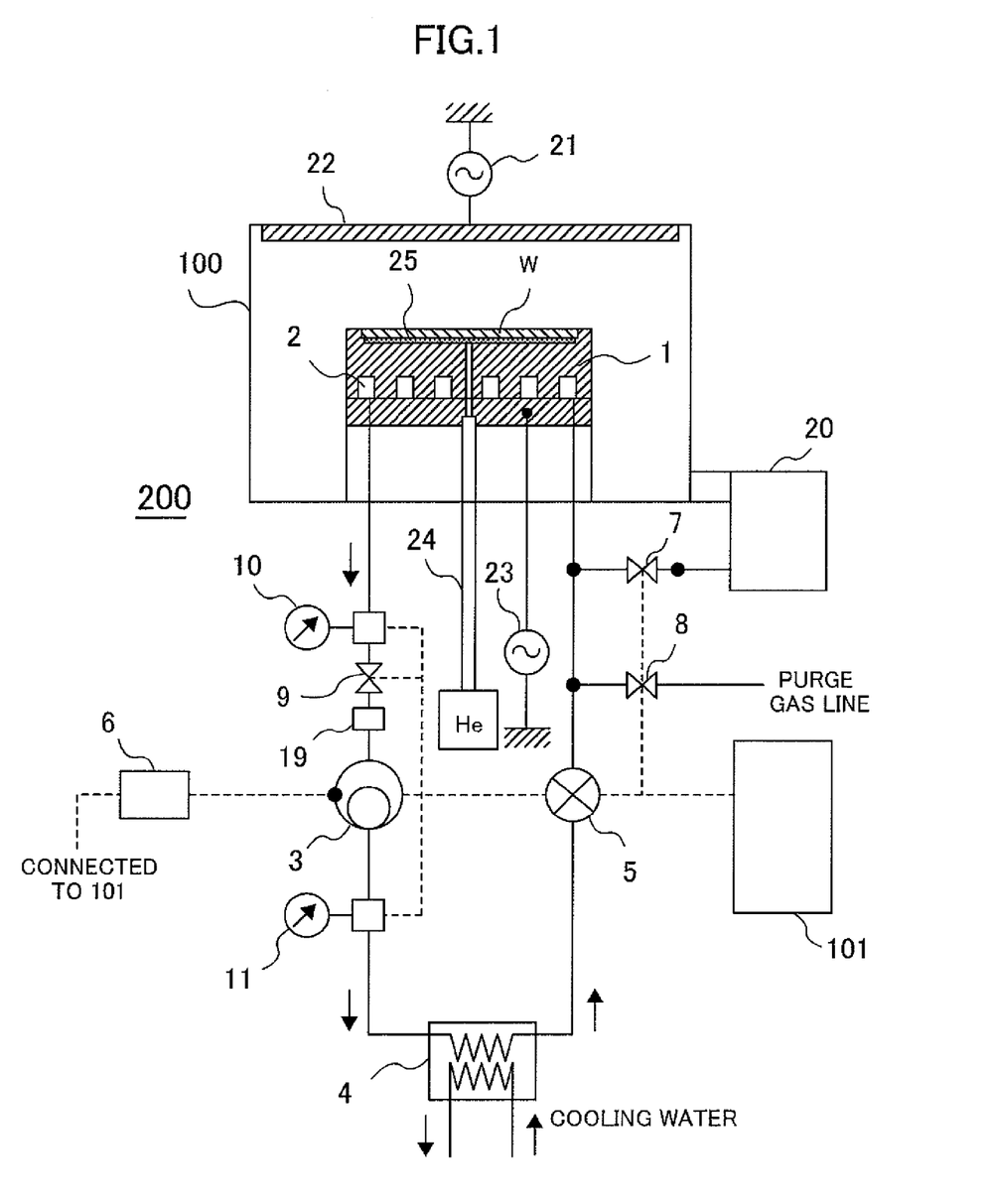
FIG. 1 is a schematic diagram showing a configuration of a temperature control unit for a sample stage included in semiconductor manufacturing equipment according to a first embodiment of the present invention.

FIG. 1 is a schematic diagram showing a configuration of a direct expansion refrigerating system of semiconductor manufacturing equipment having a sample-stage maintenance function. The semiconductor manufacturing equipment includes a processing chamber 100 disposed in a vacuum container. A sample stage 1 is disposed in the processing chamber 100. An electrode plate 22 is provided in an upper portion of the processing chamber 100 with an antenna power supply 21 connected to the electrode plate 22. The top surface of the sample stage 1 has an electrostatic adsorption function and is designed as a sample placement surface on which a sample substrate to be processed, for example, a wafer W is placed. A vacuum evacuation device 20, for example, a vacuum pump is connected to the processing chamber 100 for use in depressurizing the interior of the processing chamber 100. A heat-transfer gas supply system 24 supplies a helium gas 25 for heat transfer to a micro-gap formed between the sample placement surface of the sample stage 1 and the back surface of a wafer placed on the sample placement surface. The sample stage 1 is connected with a bias power supply 23 and a DC power supply (not shown) for electrostatic adsorption.

The semiconductor manufacturing equipment is also provided with a temperature control unit 200 which includes a direct expansion refrigerating system. The sample stage 1 is provided with a refrigerant flow path functioning as an evaporator 2 through which a refrigerant is circulated to cool the sample stage 2. The evaporator (refrigerant flow path) 2, together with a compressor 3, a condenser 4, and an expansion valve 5, configures the direct expansion refrigerating system of the temperature control unit 200. The condenser 4 has coolant water supplied thereto so as to release heat from the refrigerating cycle. A control unit 101 controls the whole semiconductor manufacturing equipment including the temperature control unit 200.

A thermometer 6 is provided for the compressor 3 so as not to overload the compressor 3 that is used, according to the present invention, to collect the refrigerant. When the compressor 3 is overloaded, its temperature rises to cause, in the worst case, internal copper wires to be burned out. To prevent such a burnout, the control unit 101 controls, for example, the rotation speed of the compressor 3 based on the temperature detected by the thermometer 6.

The system in which the temperature control unit 200 is included has a means for vacuum evacuating the refrigerating cycle, so that the refrigerating cycle can be evacuated by opening an exhaust valve 7. The system is also connected with a purge gas line, so that the refrigerating cycle can be supplied with a purge gas by opening a purge valve 8. Preferably, nitrogen is used as a purge gas, but air may also be used. A check valve 9 is provided near the refrigerant inlet of the compressor 3 to prevent, when the compressor 3 is stopped, the refrigerant from flowing back through the compressor 3. A pressure gauge 10 on the low-pressure side and a pressure gauge 11 on the high-pressure side are provided upstream and downstream of the compressor 3, respectively. A refrigerant evaporator 19 for completely evaporating the refrigerant is provided immediately in front of the inlet of the compressor 3. The refrigerant used in the present embodiment is, for example, R410.

Where a normally open valve and a normally closed valve are represented by "N.O." and "N.C.", respectively, the following valves that are controlled by the control unit 101 are represented as follows: the exhaust valve 7 (N.C.), purge valve 8 (N.C.), and check valve 9 (N.O.).

The refrigerant flow path of the refrigerating cycle included in the temperature control unit 200 is configured with a first flow path section and a second flow path section which can be separated from each other by having the expansion valve 5 and the check valve 9 opened/closed by the control unit 101. The first flow path section extends from the expansion valve 5 via the evaporator 2 in the sample stage 1 to the check valve 9. The second flow path section extends from the check valve 9 via the compressor 3 and the condenser 4 to the expansion valve 5.

When performing maintenance of the sample stage: the first flow path section and the second flow path section can be separated from each other; the whole refrigerant collected from the first flow path section can be temporarily stored in the second flow path section by operating the compressor 3 under the control of the control unit 101; and, after the maintenance is completed, the whole refrigerant that has been temporarily stored in the second flow path section can be recovered into a reusable state in the refrigerating cycle.

Figure 2:
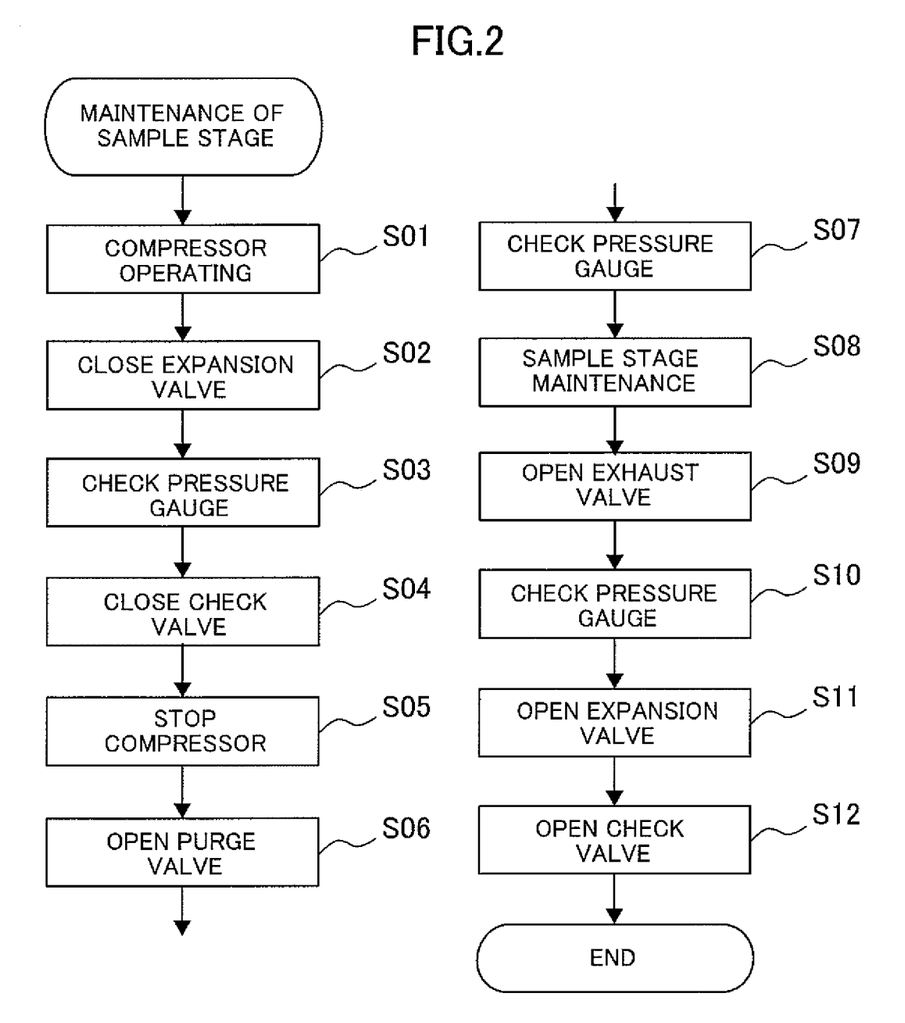
FIG. 2 is a maintenance flowchart for the sample stage according to the first embodiment.
Figure 3:
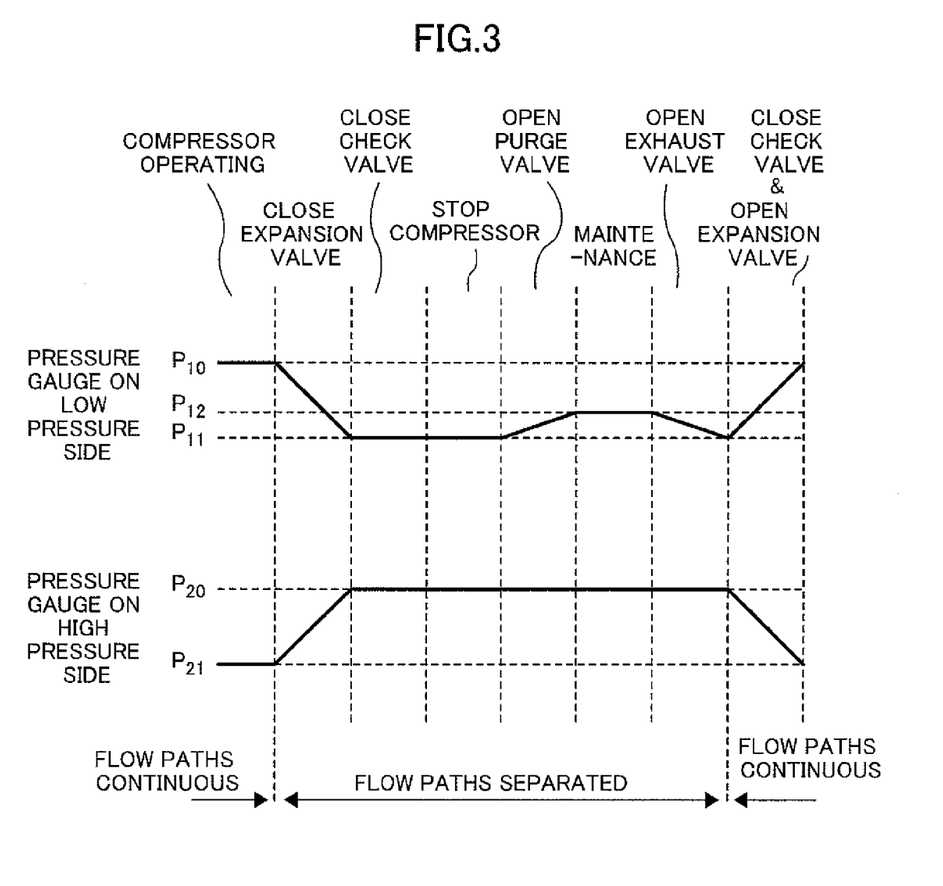
FIG. 3 shows pressure changes taking place during maintenance of the sample stage according to the first embodiment.

FIG. 2 shows the control procedure performed by the control unit 101 for maintenance of the sample stage provided with the direct expansion refrigerating system as shown in FIG. 1 and the operating procedure to be followed by an operator. FIG. 3 shows pressure changes taking place in the refrigerating cycle during maintenance of the sample stage. In the present example being described, the "maintenance of the sample stage 1" refers to replacing the sample stage 1.

Referring to FIG. 2, when the sample stage maintenance mode is entered, the control unit 101 closes, in a state with the compressor operating (S01), the expansion valve 5 completely (S02) and, thereby, stores the refrigerant in a high pressure (condensation) section, i.e. the second flow path section, extending from the expansion valve 5 via the condenser 4 to the compressor 3. This causes the refrigerant in the low-pressure (evaporation) section, i.e. the first flow path section, extending from the expansion valve 5 via the evaporator (refrigerant flow path in the sample stage) 2 to the compressor 3 to be collected into the second flow path section to put the first flow path section in a vacuum state. In cases the expansion valve 5 is one which cannot be completely closed, a valve which can be opened and completely closed by the control unit 101 may be additionally installed either upstream or downstream of the expansion valve 5.

When the refrigerant is collected into the second flow path section as described above, the compressor 3 may possibly be overloaded. To prevent overloading of the compressor 3, the thermometer 6 is installed and the load on the compressor 3 is checked based on the temperature measured by the thermometer 6. When the compressor is overloaded, its temperature rapidly rises. Normally, when a refrigerating cycle is designed, a compressor to be used is selected according to the load expected to be applied to the compressor and taking into consideration the capacity balance between the high pressure section and the low pressure section of the system, so that the compressor is not overloaded. However, if an abnormal condition occurs, for example, if a negative pressure generated in the low pressure section allows outer air to enter the refrigerating cycle through a sealed part, the load applied to the compressor 3 until the pressure in the low pressure section is reduced to a threshold value (vacuum) increases possibly resulting in burning out copper wires in the compressor 3. The thermometer 6 serves to stop the compressor 3 upon occurrence of such an abnormal condition so as to prevent the compressor 3 from being damaged. How to prevent outer air from entering the refrigerating cycle through a sealed part when the pressure in the low pressure section becomes negative will be described later with reference to FIG. 4. The refrigerant evaporator 19 installed immediately in front of the compressor 3 prevents, by making the refrigerant completely evaporate, overloading of the compressor 3. Allowing the refrigerant in a liquid state to enter the compressor 3 causes the compressor 3 to compress the incompressible fluid (liquid), so that the load on the compressor 3 increases.

Whether the refrigerant in the low pressure section, i.e. the first flow path section, has been collected into the high pressure section, i.e. the second flow path section, can be determined by reading the pressure gauge 10 on the low pressure side and the pressure gauge 11 on the high pressure side (S03).

Operations of the pressure gauges during maintenance of the sample stage will be described with reference to FIG. 3. Assume that the compressor 3 is operating with the expansion valve 5 fully open and that the pressures in the low pressure section, i.e. the first flow path section, and in the high pressure section, i.e. the second flow path section, are P10 and P21 (about 1.5 MPa when the room temperature is 20° C.), respectively. In this state, the refrigerant in the low pressure section is moved to the high pressure section by completely closing the expansion valve 5. As a result, the pressure in the low pressure section lowers from P10 to P11 and the pressure in the high pressure section rises from P21 to P20. The collection of the refrigerant into the high pressure section is continued until the reading of the pressure gauge 10 on the low pressure side decreases to P11 (threshold value). The reading P20 of the pressure gauge 11 on the high pressure side may also be used as the threshold value.

The check valve 9 is closed (S04) to prevent the refrigerant collected into the high pressure section from flowing back into the low pressure section through the compressor 3 when the compressor 3 is stopped, then the compressor 3 is stopped (S05). After the refrigerant in the low pressure section is collected into the high pressure section causing the low pressure section to be left in a vacuum state, the purge valve 8 is opened (S06) to supply a purge gas to the low pressure section. The pressure in the low pressure section is increased to the atmospheric pressure or a near-atmospheric pressure of P12 (S07). With this done, even when the evaporator (the refrigerant flow path in the sample stage 1) 2 is connected to the atmosphere to replace the sample stage 1, the refrigerant in the refrigerating cycle is not released to the outside. Maintenance such as replacement of the sample stage 1 is performed with the low pressure section in the atmospheric state (S08).

After the maintenance of the sample stage 1 is completed, the exhaust valve 7 is opened (S09) and the low pressure section in the atmospheric state (P12) is evacuated to a pressure of P11. After it is determined, by checking the pressure gauge 10 on the low pressure side, that the low pressure section has reached an adequate vacuum level (S10), the evacuation of the low pressure section is stopped, and the refrigerant stored in the high pressure section is released toward the low pressure section by opening the expansion valve 5 and the check valve 9 (S11 and S12). As a result, the pressures in the low pressure section, i.e. the first flow path section, and the high pressure section, i.e. the second flow path section, return to the initial levels, i.e. P10 and P21, respectively.

As described, maintenance of the sample stage 1 can be performed without discharging the refrigerant in the refrigerating cycle. The above maintenance procedure may be appropriately divided for execution by the control unit 101 and for execution by an operator. It is also possible to program the maintenance procedure in the control unit 101 so that every process other than the maintenance of the sample stage 1 itself is carried out automatically.

Figure 4A:
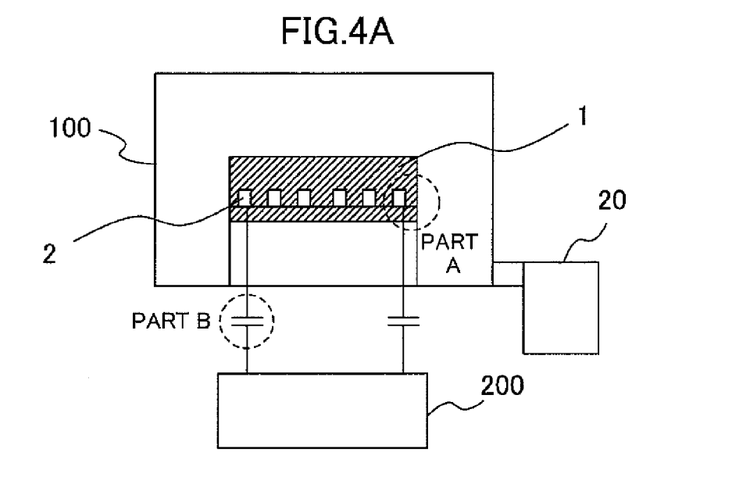
FIGS. 4A to 4C are schematic diagrams showing seal structures used in the present invention.
Figure 4B:
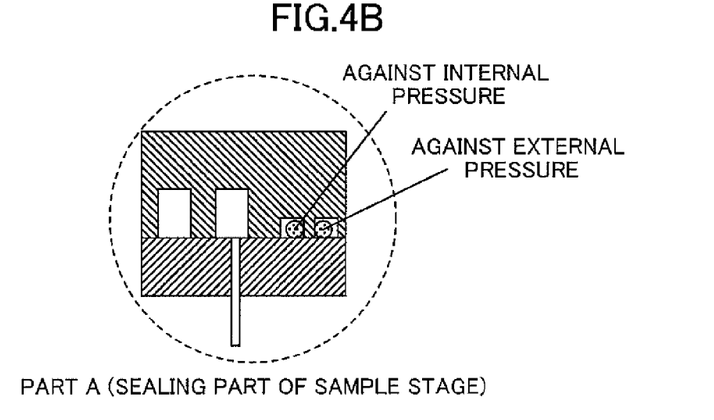
Figure 4C:
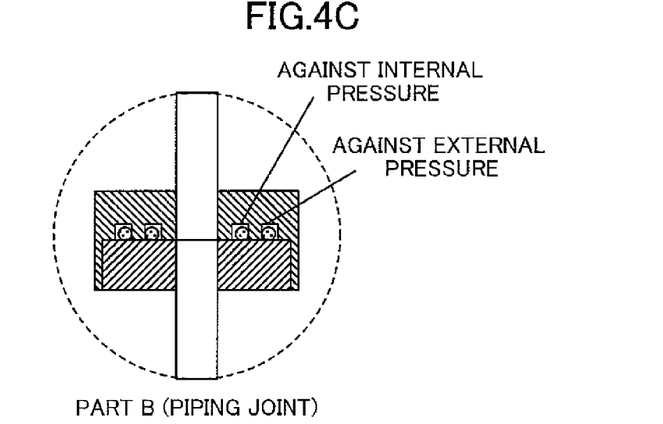

Sealing structures using O-rings required for the direct expansion refrigerating system shown in FIG. 1 will be described with reference to FIGS. 4A, 4B, and 4C. When the direct expansion refrigerating system is in normal operating mode, the pressure in the evaporator (the refrigerant flow path in the sample stage) 2 is positive. In the design stage of a refrigerating cycle, therefore, the sealing parts for use in the refrigerating cycle are designed for sealing against a positive internal pressure. When the refrigerant in the low pressure section of the refrigerating cycle is collected into the high pressure section, however, the pressure in the low pressure section evacuated by the compressor 3 becomes negative. In such a state, seals designed for sealing against an internal pressure allow outside air to enter the low pressure section to be consequently mixed with the refrigerant. This degrades the cooling performance of the refrigerating cycle. Operating the refrigerating cycle in such a state may possibly cause the compressor to be damaged.

Each sealing part of the direct expansion refrigerating system is therefore required to include a pair of seals, one against an internal pressure and the other against an external pressure so that it can meet both the positive pressure in a normal operating state and the negative pressure generated when the refrigerant in the low pressure section is collected into the high pressure section. In FIGS. 4A to 4C, part A indicates an example of a sealing part used in a peripheral part of the sample stage 1, and part B indicates an example of a sealing part used where pipes are jointed. A sealing part having a shaft seal structure can cope with both positive and negative pressures, but the seal structure according to the present invention is considered effective where a shaft seal structure is not applicable or in cases where it is necessary to increase the pressure resistance of a sealing part.

According to the present embodiment, maintenance of the sample stage of semiconductor manufacturing equipment can be performed by collecting the whole refrigerant in the refrigerating cycle into a part of the refrigerant flow path of the system without discharging any amount of refrigerant into the atmosphere and, after the maintenance, the whole refrigerant can be used again. Since it is not necessary to prepare any tank for collecting the refrigerant, the apparatus downtime for maintenance, the maintenance cost, and the environmental burden caused by the maintenance can be reduced.

Second Embodiment

A second embodiment of the present invention will be described below.

Figure 5:
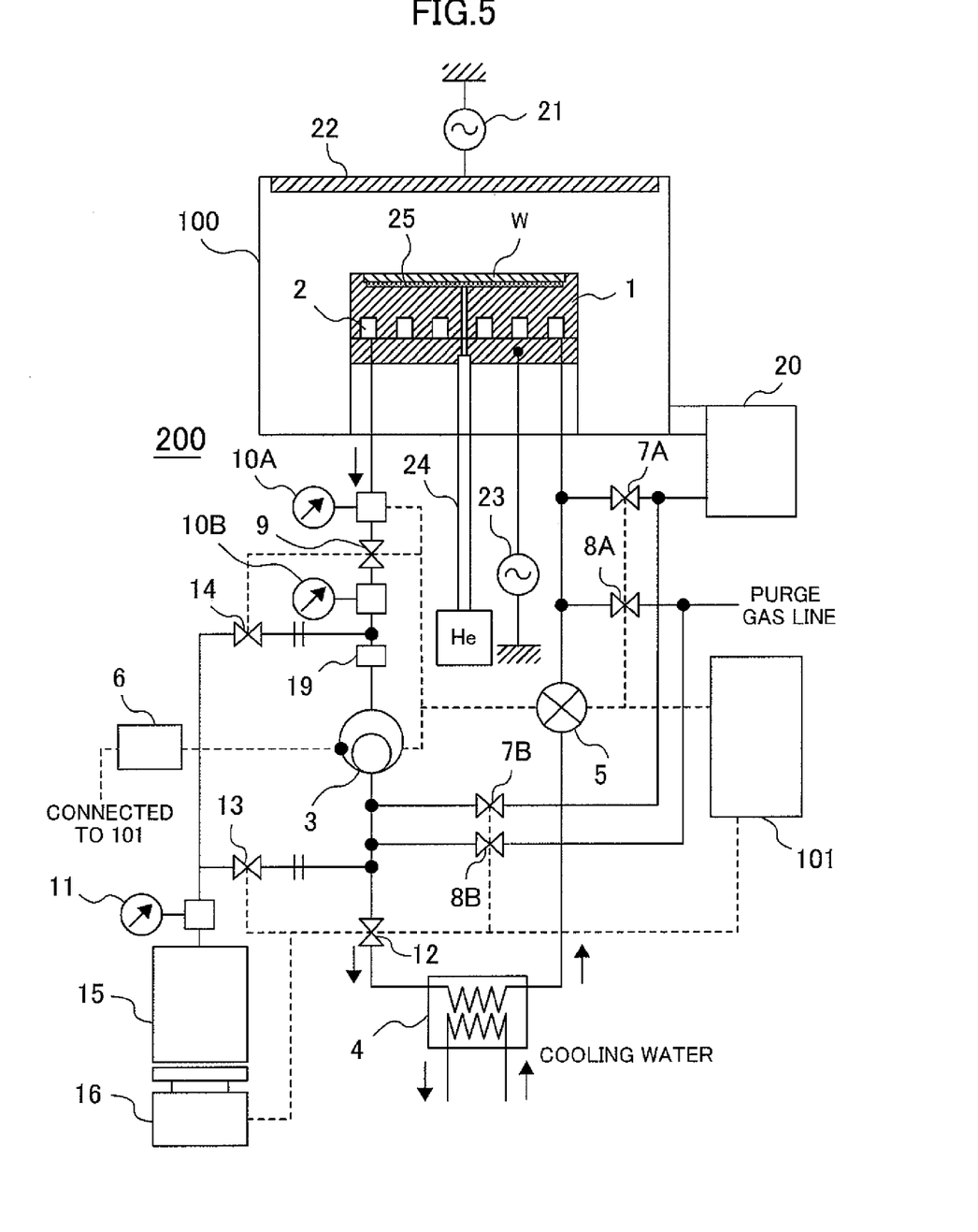
FIG. 5 is a schematic diagram showing a configuration of a temperature control unit for a sample stage included in semiconductor manufacturing equipment according to a second embodiment of the present invention.

FIG. 5 is a schematic diagram showing a system configuration of a temperature control unit 200 for a sample stage included in semiconductor manufacturing equipment according to a second embodiment of the present invention. The configuration of the temperature control unit 200 shown in FIG. 5 is equivalent to the configuration of the temperature control unit 200 shown in FIG. 1 with addition of a pressure gauge 11 on the high pressure side, a flow control valve 12, a refrigerant discharge valve 13, a refrigerant supply valve 14, a refrigerant storage tank 15, and a gravimeter for refrigerant 16.

In the present embodiment, the "maintenance of the temperature control unit" refers to maintenance of a compressor 3, a condenser 4, or an expansion valve 5. Maintenance of a sample stage 1 can be performed at the time of maintenance of the temperature control unit. Namely, maintenance of the sample stage 1 can be performed in the present embodiment, too. When performing maintenance of the sample stage 1 only, however, it is simpler to use the configuration and the procedure of the first embodiment.

Where a normally open valve and a normally closed valve are represented by "N.O." and "N.C.", respectively, the following valves that are controlled by a control unit 101 are represented as follows: exhaust valves 7A and 7B (N.C.), purge valves 8A and 8B (N.C.), check valve 9 (N.O.), flow control valve 12 (N.O.), refrigerant discharge valve 13 (N.C.), and refrigerant supply valve 14 (N.C.).

In the present embodiment, too, the refrigerant flow path of the refrigerating cycle is configured with a first flow path section and a second flow path section which can be separated from each other by having the expansion valve 5 and the check valve 9 opened/closed by the control unit 101. The first flow path section extends from the expansion valve 5 via the evaporator 2 in the sample stage 1 to the check valve 9. The second flow path section extends from the check valve 9 via the compressor 3 and the condenser 4 to the expansion valve 5.

When performing maintenance of the sample stage 1, the refrigerant in the first flow path section including the evaporator 2 can be collected, by having the control unit 101 control the compressor 3 and various types of valves, into the second flow path section to be temporarily stored there.

Figure 6:
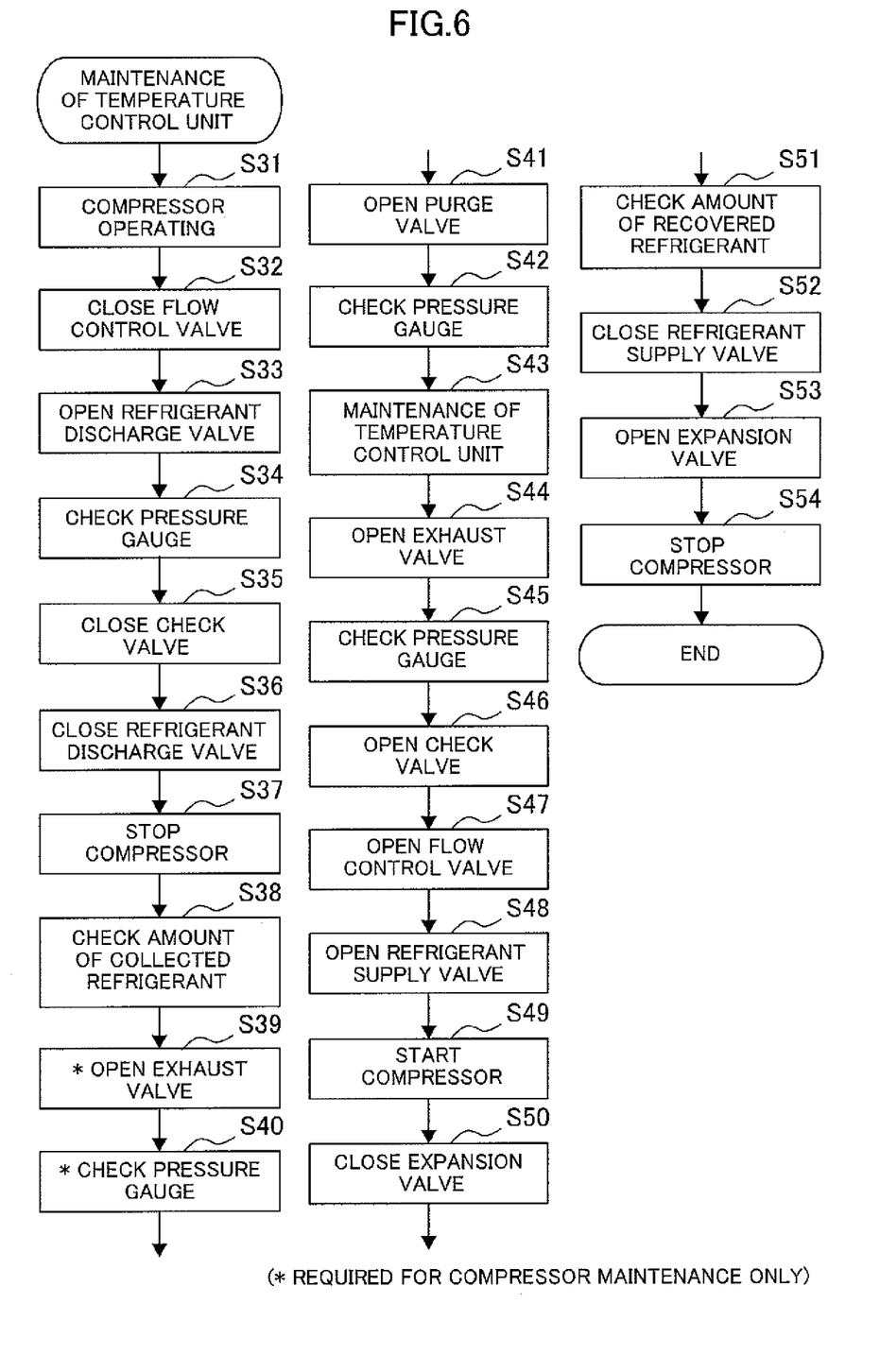
FIG. 6 is a maintenance flowchart for the temperature control unit according to the second embodiment.

FIG. 6 shows the operating procedure to be followed to perform maintenance of the temperature control unit using the system shown in FIG. 5.

The maintenance being described in the following is performed with the temperature control unit placed under the atmospheric condition. First the compressor 3 is started (S31), the flow control valve 12 is closed (S32), and the refrigerant discharge valve 13 is opened (S33). This causes the refrigerant to be sent to the refrigerant storage tank 15. With the refrigerant collected into the refrigerant storage tank 15, the low pressure (evaporative) section, i.e. the first flow path section, extending from the flow control valve 12 via the condenser 4, the expansion valve 5 and the evaporator 2 to the compressor 3 enters a vacuum state. Whether the refrigerant in the low pressure section has been collected into the refrigerant storage tank 15 can be determined by checking a pressure gauge 10A or 10B on the low pressure side (S34). When the check valve 9 and the refrigerant discharge valve 13 are subsequently closed (S35 and S36), the refrigerant is stored in the storage tank 15. After the refrigerant is stored, the compressor 3 is stopped (S37). The operating load on the compressor is monitored using a thermometer 6 provided for the compressor. To measure the amount of refrigerant stored in the storage tank 15 with high accuracy, the gravimeter for refrigerant 16 is checked (S38).

Maintenance of the condenser 4 or the expansion valve 5 included in the temperature control unit can be performed (S41 to S43) after opening the purge valve 8A (S41) and thereby supplying a purge gas to the refrigerating cycle.

For maintenance of the compressor 3, since a small amount of refrigerant remains in the second flow path section and another flow path section (a third flow path section) extending from the flow control valve 12 via the refrigerant discharge valve 13 and the refrigerant supply valve 14 to the check valve 9, it is necessary to open the exhaust valve 7B to remove the residual refrigerant in the second and the third flow path section and then open the purge valve 8B to purge the line beforehand (S39 to S42).

To start up the semiconductor manufacturing equipment after completing the maintenance of the temperature control unit, first, the refrigerating cycle that has been under the atmospheric condition is evacuated. When maintenance of the condenser 4 or expansion valve 5 is completed, the exhaust valve 7A is opened (S44) and the degree of vacuum is checked by checking the pressure gauge 10A on the low pressure side (S45). When maintenance of the compressor 3 is completed, the exhaust valve 7B is opened and the degree of vacuum is checked by checking the pressure gauge 10B on the low pressure side. After the evacuation is completed, the check valve 9 and the flow control valve 12 are opened (S46 and S47), then the refrigerant supply valve 14 is opened (S48). When the compressor 3 is subsequently started (S49), the refrigerant is supplied from the refrigerant storage tank 15 to the refrigerating cycle.

To completely recover the refrigerant from the refrigerant storage tank 15, the refrigerant storage tank 15 is evacuated by closing the expansion valve 5 (S50), thereby causing the refrigerant to be stored in the second flow path section extending from the compressor 3 via the condenser 4 to the expansion valve 5. The amount of refrigerant recovered from the storage tank 15 can be determined by checking the pressure gauge 11 and the gravimeter for refrigerant 16 (S51). After it is determined that an adequate amount of refrigerant has been recovered, the refrigerant supply valve 14 is closed (S52), the expansion valve 5 is opened (S53), and the compressor 3 is stopped (S54).

The above maintenance procedure may be appropriately divided for execution by the control unit 101 and for execution by an operator. It is also possible to program the maintenance procedure in the control unit 101 so that every process other than the maintenance of the temperature control unit is carried out fully automatically.

According to the present embodiment, even though a refrigerant storage tank is required, maintenance of the compressor 3, condenser 4, or expansion valve 5 can be performed allowing almost no refrigerant to be released to the atmosphere.

The above system configuration and the maintenance procedure of the present invention make it unnecessary to replace the refrigerant every time maintenance of the temperature control unit is performed. Namely, the apparatus downtime for maintenance can be reduced because it is not necessary to supply refrigerant again and then check the performance of the refrigerating cycle; the maintenance cost can be reduced since the refrigerant need not be replaced; and the environmental burden caused by maintenance can be reduced because the refrigerant need not be disposed of.

Third Embodiment

A third embodiment of the present invention will be described below.

Figure 7:
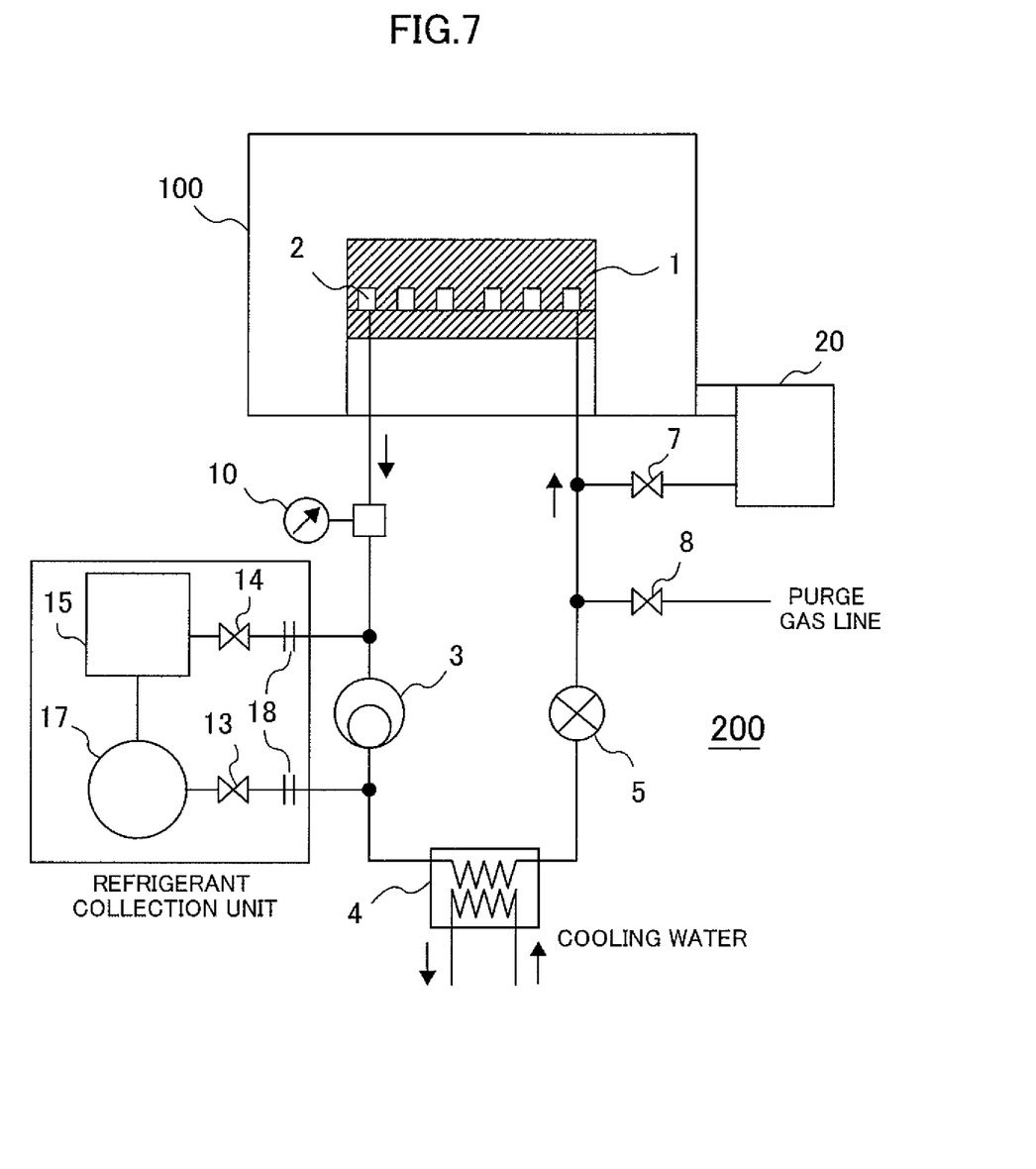
FIG. 7 is a schematic diagram showing a configuration of a temperature control unit for a sample stage included in semiconductor manufacturing equipment according to a third embodiment of the present invention.

FIG. 7 is a schematic diagram showing a configuration of a temperature control unit for a sample stage included in semiconductor manufacturing equipment according to a third embodiment of the present invention. In the third embodiment, an external refrigerant collection unit connected to a refrigerating cycle is used. In the basic configuration of the present embodiment, a vacuum exhaust unit 17 (for example, a rotary pump) is provided rearward of a refrigerant discharge valve 13 with a refrigerant storage tank 15 disposed rearward of the vacuum exhaust unit 17. A refrigerant supply valve 14 is provided between the refrigerant storage tank 15 and the refrigerating cycle. The refrigerant collection unit has piping joints 18 and can be connected to and disconnected from the refrigerating cycle.

Where a normally open valve and a normally closed valve are represented by "N.O." and "N.C.", respectively, the following valves that are controlled by a control unit (not shown) are represented as follows: exhaust valve 7 (N.C.), purge valve 8 (N.C.), refrigerant discharge valve 13 (N.C.), and refrigerant supply valve 14 (N.C.).

The refrigerant in the refrigerating cycle can be collected into the refrigerant storage tank 15 by opening the refrigerant discharge valve 13 and starting the vacuum exhaust unit 17. Whether the refrigerant has been collected into the refrigerant storage tank 15 can be determined by checking a pressure gauge 10 on the low pressure side. The collection of the refrigerant ends when the refrigerant discharge valve 13 is closed. When the refrigerant is collected into the refrigerant storage tank 15, the refrigerating cycle enters a vacuum state. The system is then purged by opening the purge valve 8. The refrigerant storage tank 15 is preferably equipped with a gravimeter for refrigerant so that the amount of refrigerant in the refrigerant storage tank 15 can be quantitatively determined. The refrigerant in the refrigerant storage tank 15 can be recovered into the refrigerating cycle by, after opening the exhaust valve 7 and thereby evacuating the refrigerating cycle, opening the refrigerant supply valve 14, closing the expansion valve 5, and starting the compressor 3. Whether the refrigerant has been recovered can be determined by checking the pressure gauge 10 on the low pressure side or the gravimeter for refrigerant. Closing the refrigerant supply valve 14 ends the recovering of the refrigerant.

Even though the above maintenance procedure requires an external vacuum exhaust unit to be used and therefore increases the maintenance cost, it allows even maintenance of a compressor to be performed without changing the amount of refrigerant in the refrigerating cycle.

Fourth Embodiment

The operation performed for etching in a system configured as described for the first or second embodiment will be described below with reference to FIG. 1 or FIG. 5. The electrode plate 22 is provided in an upper portion of the processing chamber 100 with the antenna power supply 21 connected to the electrode plate 22. A gas introducing unit, for example, a shower plate (not shown) for supplying a processing gas is also provided in an upper portion of the processing chamber 100. The sample stage 1 is covered with a dielectric film having an electrostatic adsorption function. The top surface of the sample stage 1 is designed as a sample placement surface on which a wafer W to be processed is placed. The heat-transfer gas supply system 24 supplies a helium gas 25 for heat transfer to a micro-gap formed between the sample placement surface of the sample stage 1 and the back surface of the wafer placed on the sample placement surface. The sample stage 1 is connected with the bias power supply 23 and a DC power supply (not shown) for electrostatic adsorption.

The etching operation performed in the above system configuration will be briefly described below. First, a wafer W is brought into the processing chamber 100 and fixed on the sample stage 1. Next, a process gas is filled into the processing chamber 100 and the interior of the processing chamber 100 is adjusted to a prescribed process pressure. Then, a plasma is generated in the processing chamber 100 using the power supplied from the antenna power supply 21 and the bias power supply 23 and the effect of a magnetic field generation unit (not shown), and the wafer W is etched using the plasma. For wafer temperature control during the etching process, the control unit 101 monitors the temperature information obtained from a sample stage temperature sensor (not shown) and feedback-controls the compressor 3 and the expansion valve 5 thereby adjusting the flow amount of refrigerant and the refrigerant evaporating temperature. Using the system configuration and the control method described above makes it possible to process a whole target surface of the wafer W with high accuracy even in cases where a high input heat is used for etching by applying a high wafer bias power.

The above system configuration includes constituent parts used in the first or second embodiment. Maintenance of the sample stage can be performed using a procedure similar to that used in the first embodiment. Maintenance of the temperature control unit can be performed using a procedure similar to that used in the second embodiment. When the system configuration of the second embodiment is used, increasing the amount of refrigerant stored in the refrigerant storage tank 15 beyond an amount normally required for the refrigerating cycle makes it possible to adjust, i.e. increase or decrease, the amount of refrigerant filled in the refrigerating cycle. The amount of refrigerant filled in the refrigerating cycle can be controlled even while the refrigerating cycle is in operation. It is therefore possible to optimally adjust the amount of refrigerant filled in the refrigerating cycle according to individual steps of the etching process.

When the maintenance operation as described above is performed or when the amount of refrigerant is controlled, the control unit 101 controls the operations of relevant constituent parts. It is possible to have such operation or control performed automatically by loading a required program in the control unit.

The evaporator to be included in each of the refrigerating cycles according to the first to third embodiments of the present invention need not be one provided in a sample stage as described above. The evaporator to be included in the refrigerating cycle of the present invention may be of a different material or of a modified shape, or one designed for use under the atmospheric condition.

The applications of the temperature control unit included in the plasma processing apparatus according to the present invention are not limited to the above embodiments. The temperature control unit can also be used for other devices requiring quick and uniform temperature control covering an entire surface of a wafer, for example, an asking device, a sputtering system, ion implantation equipment, a resist coater, a plasma CVD system, flat panel display manufacturing equipment, and solar cell manufacturing equipment.

What is claimed is:

1. A plasma processing apparatus which has a vacuum process chamber including a sample stage installed therein and which generates a plasma from a process gas introduced thereinto and processes, using the plasma, a surface of a sample placed on the sample stage, the plasma processing apparatus comprising:
   a refrigerating cycle including a refrigerant flow path which is disposed in the sample stage, a compressor, a condenser, which are coupled by refrigerant pipes in this order and through which a refrigerant circulates in the order, the sample stage functioning as an evaporator in the refrigerating cycle;
   a first valve disposed on the refrigerant pipe between the compressor and an inlet of the refrigerant flow path in the sample stage, the first valve being configured to enable to close completely;
   a backflow preventing valve disposed on the refrigerant pipe between an outlet of the refrigerant flow path in the sample stage and the compressor, the backflow preventing valve being capable of preventing the refrigerant from flowing backward through the compressor; and
   a control unit which controls functions of the compressor, the first valve and the backflow preventing valve respectively,
   wherein the refrigerating cycle is configured to be laid out into a first flow section extending from the first valve to the backflow preventing valve and a second flow section extending from the backflow preventing valve via the compressor to the first valve, the first and second flow sections being mutually separatable, and includes a refrigerant storage tank which communicates with the refrigerant pipes in the second flow section at both positions of an upstream and a downstream of the compressor; and
   wherein the control unit operates, during maintenance of one of the compressor, the condenser and the sample stage, the compressor with the first valve being closed completely to collect the refrigerant present in the first flow section into the refrigerant storage tank through the position downstream of the compressor to be temporarily stored therein, and, after the maintenance is finished, the refrigerant temporarily stored in the refrigerant storage tank is returned, by operation of the compressor, from the position upstream of the compressor and into the first flow section through the second flow section in a state in which the refrigerant is usable again in the refrigerating cycle.

2. The plasma processing apparatus according to claim 1, the refrigerating cycle further comprising a refrigerant evaporator disposed in between the compressor and the backflow preventing valve, the refrigerant evaporator being able to completely evaporate the refrigerant.

3. The plasma processing apparatus according to claim 2, wherein a dual refrigerant sealing structure for sealing against an internal pressure and an external pressure is used in the refrigerating cycle.

4. The plasma processing apparatus according to claim 2, wherein the refrigerating cycle further comprises a temperature measuring unit which can monitor a load on the compressor.

5. The plasma processing apparatus according to claim 1, wherein the first valve is a flow control valve disposed on the refrigerant pipe between the compressor and the condenser.

6. The plasma processing apparatus according to claim 1, wherein a dual refrigerant sealing structure for sealing against an internal pressure and an external pressure is used in the refrigerating cycle.

7. The plasma processing apparatus according to claim 1, wherein the refrigerating cycle further comprises a temperature measuring unit which can monitor a load on the compressor.

8. The plasma processing apparatus according to claim 1, wherein the refrigerant storage tank communicates with the refrigerant pipes, at the position upstream of the compressor, in the second flow section between the backflow preventing valve and the compressor.

9. A plasma processing apparatus which has a vacuum process chamber including a sample stage installed therein and which generates a plasma from a process gas introduced thereinto and processes, using the plasma, a surface of a sample placed on the sample stage, the plasma processing apparatus comprising:
   a refrigerating cycle including a refrigerant flow path which is disposed in the sample stage, a compressor, and a condenser, which are coupled by refrigerant pipes in this order and through which a refrigerant circulates in the order, the sample stage functioning as an evaporator in the refrigerating cycle;
   a first valve disposed on the refrigerant pipe between the compressor and an inlet of the refrigerant flow path in the sample stage, the first valve being configured to enable to close completely;
   a backflow preventing valve disposed on the refrigerant pipe between an outlet of the refrigerant flow path in the sample stage and the compressor, the backflow preventing valve being capable of preventing the refrigerant from flowing backward through the compressor; and
   a control unit which controls functions of the compressor, the first valve and the backflow preventing valve respectively;
   wherein the refrigerating cycle is configured to be laid out into a first flow section extending from the first valve to the backflow preventing valve and a second flow section extending from the backflow preventing valve via the compressor to the first valve, and includes a refrigerant storage tank coupled to the refrigerant pipes in the second flow section at both positions downstream and upstream of the compressor via a second valve and a third valve respectively which are configured to be able to open and close, the first and second flow sections being mutually separatable; and wherein the control unit operates, during maintenance of one of the compressor, the condenser, and the sample stage, the compressor with the first valve being closed completely and the second valve being opened to collect the refrigerant present in the first flow section into the refrigerant storage tank to be temporarily stored therein, and, after the maintenance is finished, the refrigerant temporarily stored in the refrigerant storage tank is returned, by operation of the compressor, via the third valve which opens into the second flow section, and flows through the second flow section to the first flow section in a state in which the refrigerant is usable again in the refrigerating cycle.

10. The plasma processing apparatus according to claim 9, wherein the refrigerant storage tank is provided with a gravimeter for monitoring a weight of refrigerant filled in the refrigerating cycle.

11. The plasma processing apparatus according to claim 9, wherein the control unit operates the compressor, before the maintenance of the compressor is performed, to collect the refrigerant present in the first flow section into the refrigerant storage tank, and operates the second valve being closed, and, after the maintenance is finished, operates the compressor to return the refrigerant stored in the refrigerant storage tank to the second flow section in a state in which the refrigerant is usable again in the refrigerating cycle.

12. The plasma processing apparatus according to claim 9, wherein the first valve is a flow control valve disposed on the refrigerant pipe between the compressor and the condenser.

13. The plasma processing apparatus according to claim 9, wherein the refrigerant storage tank communicates with the refrigerant pipes, at the position upstream of the compressor, in the second flow section between the backflow preventing valve and the compressor.

14. A maintenance method for a plasma processing apparatus which has a vacuum process chamber including a sample stage installed therein and which generates a plasma from a process gas introduced thereinto and processes, using the plasma, a surface of a sample placed on the sample stage, the plasma processing apparatus comprising:

a refrigerating cycle including a refrigerant flow path which is disposed in the sample stage, a compressor, and a condenser, which are coupled by refrigerant pipes in this order and through which a refrigerant circulates in the order, the sample stage functioning as an evaporator in the refrigerating cycle;

a first valve disposed on the refrigerant pipe between the compressor and an inlet of the refrigerant flow path in the sample stage, the first valve being configured to enable to close completely;

a backflow preventing valve disposed on the refrigerant pipe between an outlet of the refrigerant flow path in the sample stage and the compressor, the backflow preventing valve being capable of preventing the refrigerant from flowing backward through the compressor; and a control unit which controls functions of the compressor, the first valve and the backflow preventing valve respectively, wherein the refrigerating cycle is configured to be laid out into a first flow section extending from the first valve to the backflow preventing valve and a second flow section extending from the backflow preventing valve via the compressor to the first valve, and includes a refrigerant storage tank coupled to the refrigerant pipes in the second flow section at both positions upstream and downstream of the compressor via a second valve and a third valve respectively which are able to open and close, the first and second flow sections being mutually separatable; and wherein, during maintenance of one of the compressor, the condenser, and the sample stage, collecting refrigerant present in the first flow section, by running the compressor with the first valve being closed completely and the second valve being open, into the refrigerant storage tank to be temporarily stored therein;

the maintenance method further comprising:

performing maintenance of the sample stage; and after the maintenance is finished, returning the refrigerant temporarily stored in the refrigerant storage tank, by operation of the compressor, into the second flow section via the third valve which is opened and providing the refrigerant to the first flow section through the second flow section in a state in which the refrigerant is usable again in the refrigerating cycle.

15. The maintenance method for plasma processing apparatus according to claim 14, the maintenance method further comprising a step of evaporating completely the refrigerant by a refrigerant evaporator disposed in between the compressor and the backflow preventing valve.

16. The maintenance method for the plasma processing apparatus according to claim 14, wherein the first valve is a flow control valve disposed on the refrigerant pipe between the compressor and the condenser.

17. The maintenance method for a plasma processing apparatus according to claim 14, wherein the refrigerant storage tank communicates with the refrigerant pipes, at the position upstream of the compressor, in the second flow section between the backflow preventing valve and the compressor.

* * * * *